(12) United States Patent
Chang et al.

(10) Patent No.: US 11,335,424 B2
(45) Date of Patent: May 17, 2022

(54) ONE-TIME PROGRAMMABLE MEMORY BIT CELL

(71) Applicant: Taiwan Semiconductor Manufacturing Company, Ltd., Hsinchu (TW)

(72) Inventors: Meng-Sheng Chang, Chu-bei (TW); Yao-Jen Yang, Hsinchu County (TW); Min-Shin Wu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/233,771

(22) Filed: Apr. 19, 2021

(65) Prior Publication Data

US 2021/0249095 A1    Aug. 12, 2021

Related U.S. Application Data

(63) Continuation of application No. 16/787,312, filed on Feb. 11, 2020, now Pat. No. 10,984,878.

(51) Int. Cl.
| | | |
|---|---|---|
| *G11C 17/16* | (2006.01) | |
| *G11C 11/408* | (2006.01) | |
| *G11C 11/56* | (2006.01) | |
| *G11C 11/4074* | (2006.01) | |
| *G11C 11/4094* | (2006.01) | |

(52) U.S. Cl.
CPC .......... *G11C 17/16* (2013.01); *G11C 11/4074* (2013.01); *G11C 11/4085* (2013.01); *G11C 11/4094* (2013.01); *G11C 11/5642* (2013.01)

(58) Field of Classification Search
CPC ............ G11C 11/4085; G11C 11/4074; G11C 11/4094; G11C 11/5642; G11C 17/16; G11C 16/0408; G11C 16/0433
See application file for complete search history.

(56) References Cited

U.S. PATENT DOCUMENTS

| | | | | |
|---|---|---|---|---|
| 9,196,377 | B1 | 11/2015 | Park | |
| 2016/0148705 | A1* | 5/2016 | Lee | G11C 17/18 365/96 |
| 2019/0392911 | A1* | 12/2019 | Jo | G11C 7/12 |

FOREIGN PATENT DOCUMENTS

TW        201612916 A     4/2016

\* cited by examiner

*Primary Examiner* — Ajay Ojha
(74) *Attorney, Agent, or Firm* — Merchant & Gould P.C.

(57) ABSTRACT

A memory bit cell includes a first memory cell including a first antifuse transistor and a first selection transistor, the first antifuse transistor being selectable between a first state or a second state in response to a word line program signal, the first selection transistor being configured to provide access to the first antifuse transistor in response to a word line read signal; a second memory cell including a second antifuse transistor and a second selection transistor, the second antifuse transistor being selectable between the first state or the second state in response to the word line program signal, the second selection transistor being configured to provide access to the second antifuse transistor in response to the word line read signal; a first word line to selectively provide the word line program signal; a second word line to selectively provide the word line read signal; and a bit line.

20 Claims, 9 Drawing Sheets

ONE-TIME PROGRAMMABLE MEMORY BIT CELL

CROSS-REFERENCE TO RELATED APPLICATION

This application is a continuation of application Ser. No. 16/787,312, filed Feb. 11, 2020, now U.S. Pat. No. 10,984,878, which application is incorporated herein by reference in its entirety.

BACKGROUND

Many modern day electronic devices include electronic memory. Electronic memory is a device configured to store bits of data in respective memory cells. A memory cell is a circuit configured to store a bit of data, typically using one or more transistors. One type of an electronic memory is one-time programmable (OTP) memory. An OTP memory is a read-only memory that may be programmed (e.g., written to) only once.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One-time programmable (OTP) memory devices include electrical fuse (eFuse) and antifuse. An eFuse is programmed by electrically blowing a strip of metal or poly with a flow of high-density current using I/O voltage. An antifuse is programmed by electrically shorting the gate and source of a transistor with an dielectric breakdown when a high voltage is applied to the thin gate dielectric layer of the transistor. Examples of the gate dielectric materials may include high-k dielectric, silicon dioxide, and silicon oxynitride, though other gate dielectric materials may also be employed. The thickness of the thin gate dielectric layer is lower than the thickness of a regular gate dielectric layer. An antifuse starts with a high resistance state and ends up with a permanent electrically conductive path (a low resistance state).

Typically, an OTP memory device using antifuse has a two-transistor (2T) per bit arrangement. Specifically, each bit corresponds to a cell. Each cell has a two-transistor structure including two transistors: an antifuse transistor and a selection transistor. However, the cell with the two-transistor structure may have a small cell current which is hard to be read on-cell. Moreover, in order to reduce path resistance, it is difficult to put vertical interconnect accesses (vias) on active regions (OD regions) and gate (poly) strips to connect metal tracks for bit line (BL) signals and word line (WL) signals.

In accordance with some disclosed examples, multiple (e.g., two or four) OTP memory cells are used to form a bit cell which stores one bit of data. The multiple OTP memory cells in the same bit cell share a first word line, a second word line, and a bit line. Compared with the two-transistor per bit (i.e., 1 cell per bit) arrangement, the multiple cells per bit arrangement results in a bigger current which is easier to be read on-cell. The flexibility to put vias on active regions and gate strips to connect metal tracks for bit line signals and word line signals increases.

Figure 1:
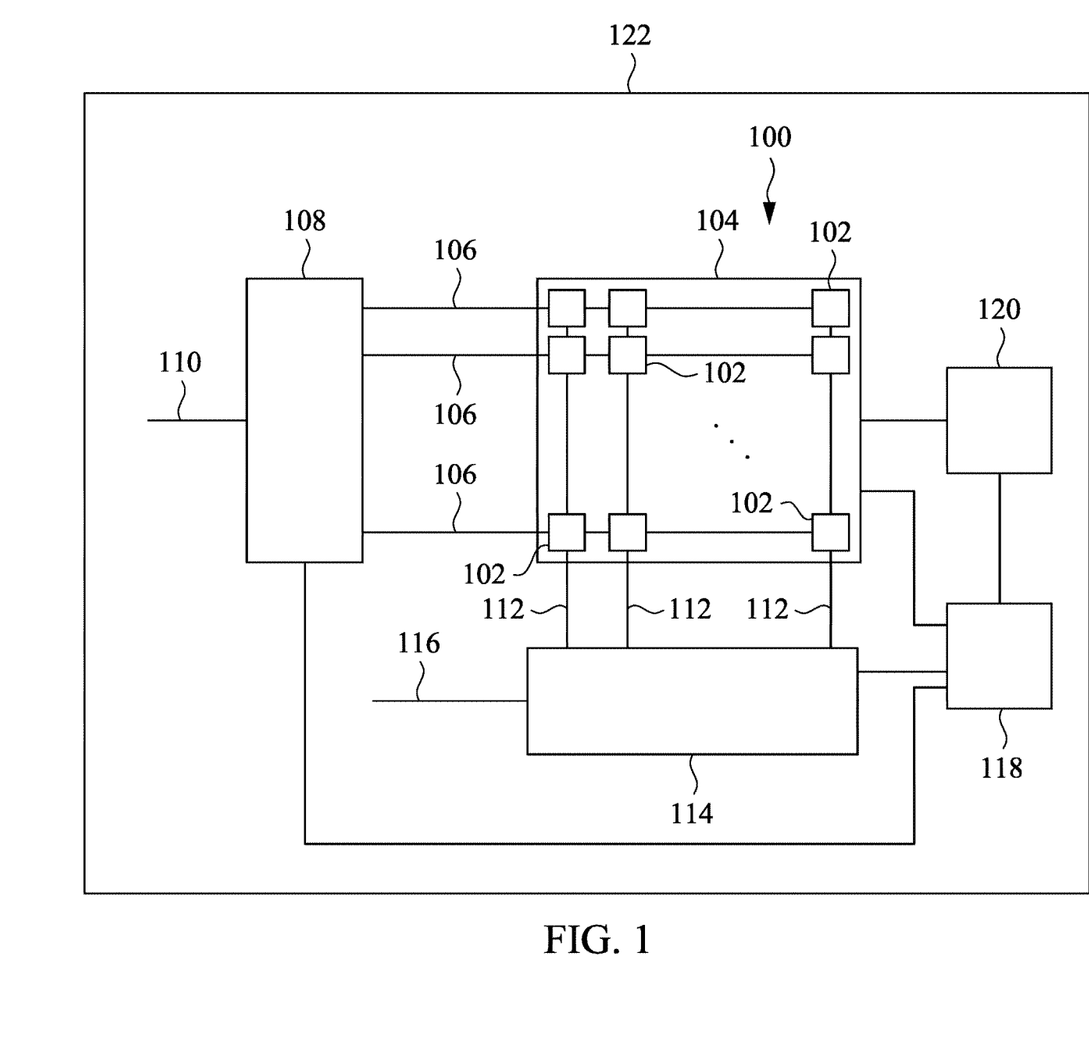
FIG. 1 is a block diagram of a memory device in which aspects of the disclosure may be practiced in accordance with some embodiments.

FIG. 1 illustrates a block diagram of a memory device 100 in which aspects of the disclosure may be practiced in accordance with some embodiments. In the illustrated embodiment, the memory device 100 includes memory cells 102 that are arranged in rows and columns to form a memory array 104. The memory device 100 can include any suitable number of rows and columns. For example, a memory device includes R number of rows and C number of columns, where R is an integer greater than or equal to 1 and C is a number greater than or equal to 2. As will be described in more detail later, in one embodiment the memory cells 102 are OTP memory cells that include an antifuse transistor and a selection transistor.

Each row of memory cells 102 is operatively connected to one or more word lines (collectively word line 106). The word lines 106 are operatively connected to one or more row select circuits (collectively referred to as row select circuit 108). The row select circuit 108 selects a particular word line 106 based on an address signal that is received on a signal line 110.

Each column of memory cells 102 is operatively connected to one or more bit lines (collectively bit line 112). The bit lines 112 are operatively connected to one or more column select circuits (collectively referred to as column select circuit 114). The column select circuit 114 selects a particular bit line 112 based on a select signal that is received on a signal line 116. It should be noted that the arrangement of rows and columns can be different from the illustrated example in FIG. 1 in other embodiments. In other words, each row of memory cells 102 may be operatively connected to one or more bit lines 112, whereas each column of memory cells 102 may be operatively connected to one or more word lines 106.

A processing device 118 is operatively connected to the memory array 104, the row select circuit 108, and the column select circuit 114. The processing device 118 is operable to control one or more operations of the memory array 104, the row select circuit 108, and the column select circuit 114. Any suitable processing device can be used. Example processing devices include, but are not limited to, a central processing unit, a microprocessor, an application specific integrated circuit, a graphics processing unit, a field programmable gate array, or combinations thereof.

A power supply 120 is at least operatively connected to the memory array 104 and the processing device 118. The processing device 118 can cause one or more bias voltages to be applied to the memory cells 102 in the memory array 104.

The processing device 118 and/or the power supply 120 can be disposed in the same circuitry (e.g., the same integrated circuit) as the memory array 104, or the processing device 118 and/or the power supply 120 may be disposed in separate circuitry from the memory array 104 and operatively connected to the memory array 104. The memory device 100, the processing device 118, and the power supply 120 are included in an electronic device 122. Example electronic devices include, but are not limited to, a computing device, a television, a camera, and a wearable device.

When data is to be written to a memory cell 102 (e.g., the memory cell 102 is programmed), or read from a memory cell 102, an address for the memory cell is received on signal line 110. The row select circuit 108 activates or asserts the word line 106 associated with the address. A select signal is received on the signal line 116 and the bit line 112 associated with the select signal is asserted or activated. The data is then written to, or read from, the memory cell 102.

Figure 2:
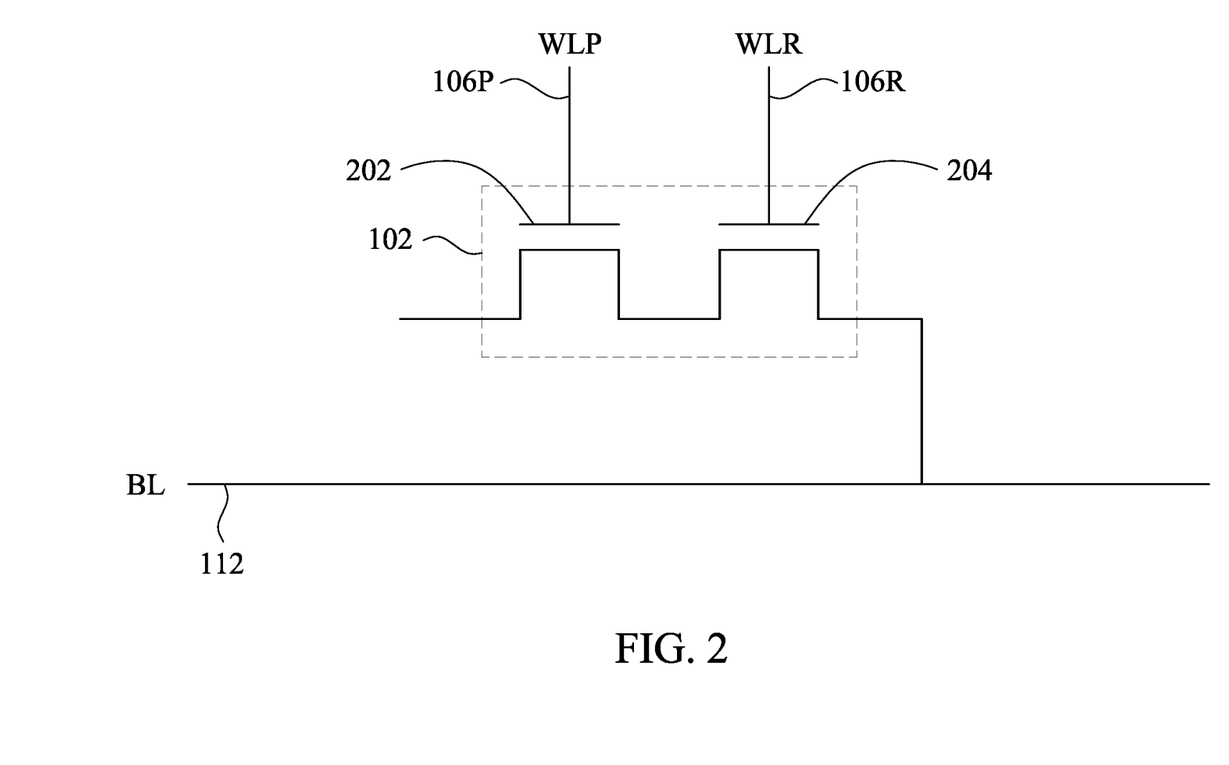
FIG. 2 is a schematic diagram of an OTP memory cell in accordance with some embodiments.

FIG. 2 depicts a schematic diagram of an OTP memory cell in accordance with some embodiments. The OTP memory cell 102 is formed with a first transistor 202 connected in series with a second transistor 204. In the illustrated example, the first transistor 202 is an antifuse transistor 202, and the second transistor 204 is a selection transistor 204. The thickness of a gate dielectric layer of the antifuse transistor 202 is lower than the thickness of a gate dielectric layer of the selection transistor 204. A gate of the antifuse transistor 202 receives a word line program (WLP) signal on a word line 106P. A gate of the selection transistor 204 receives a word line read (WLR) signal on another word line 106R. A source or a drain of the selection transistor 204 is connected to a bit line 112. Any suitable type of transistor can be used. In one embodiment, the antifuse transistor 202 and the selection transistor 204 are metal oxide semiconductor (MOS) transistors. In another embodiments, the antifuse transistor 202 and the selection transistor 204 are fin field-effect transistors (FinFETs). In one embodiment, the antifuse transistor 202 may be n-type as illustrated in FIG. 2. In another embodiment, the antifuse transistor 202 may be p-type. In one embodiment, the selection transistor 204 may be n-type as illustrated in FIG. 2. In another embodiment, the selection transistor 204 may be p-type.

During programming, a high voltage is applied to a thin gate dielectric layer of the antifuse transistor 202. As a result, a resultant avalanche breakdown causes the gate and source of the antifuse transistor 202 to be shorted. Thus, the antifuse transistor 202 is in a low resistance state with a permanent electrically conductive path. In the illustrated example, the selection transistor 204 is an n-type transistor. When the WLR signal is at logical high (i.e., "1"), the selection transistor 204 is turned on. When the bit line 112 is asserted or activated, data is then written to, or read from, the memory cell 102. In summary, the antifuse transistor 202 is configured to store a first state (e.g., a low resistance state) or a second state (e.g., a high resistance state) in response to the WLP signal provided on a first word line 106P, the selection transistor 204 is configured to provide access to the antifuse transistor 202 in response to a WLR signal provided on a second word line 106R, and the selection transistor 204 is electrically connected to a bit line 112 for sensing the first state or the second state. As such, a bit of data corresponding to the first state or the second state is written to, or read from, the memory cell 102.

Figure 3:
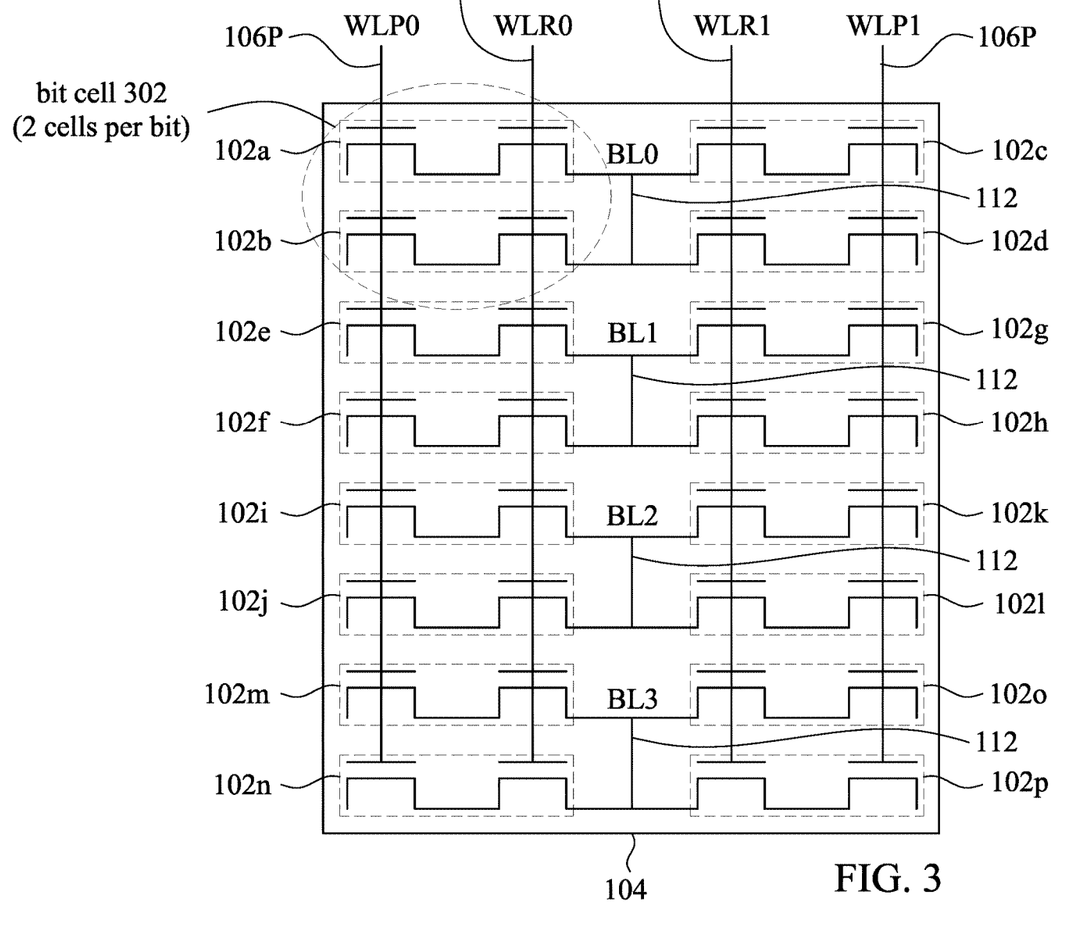
FIG. 3 is a structure diagram of a memory array in accordance with some embodiments.
Figure 4:
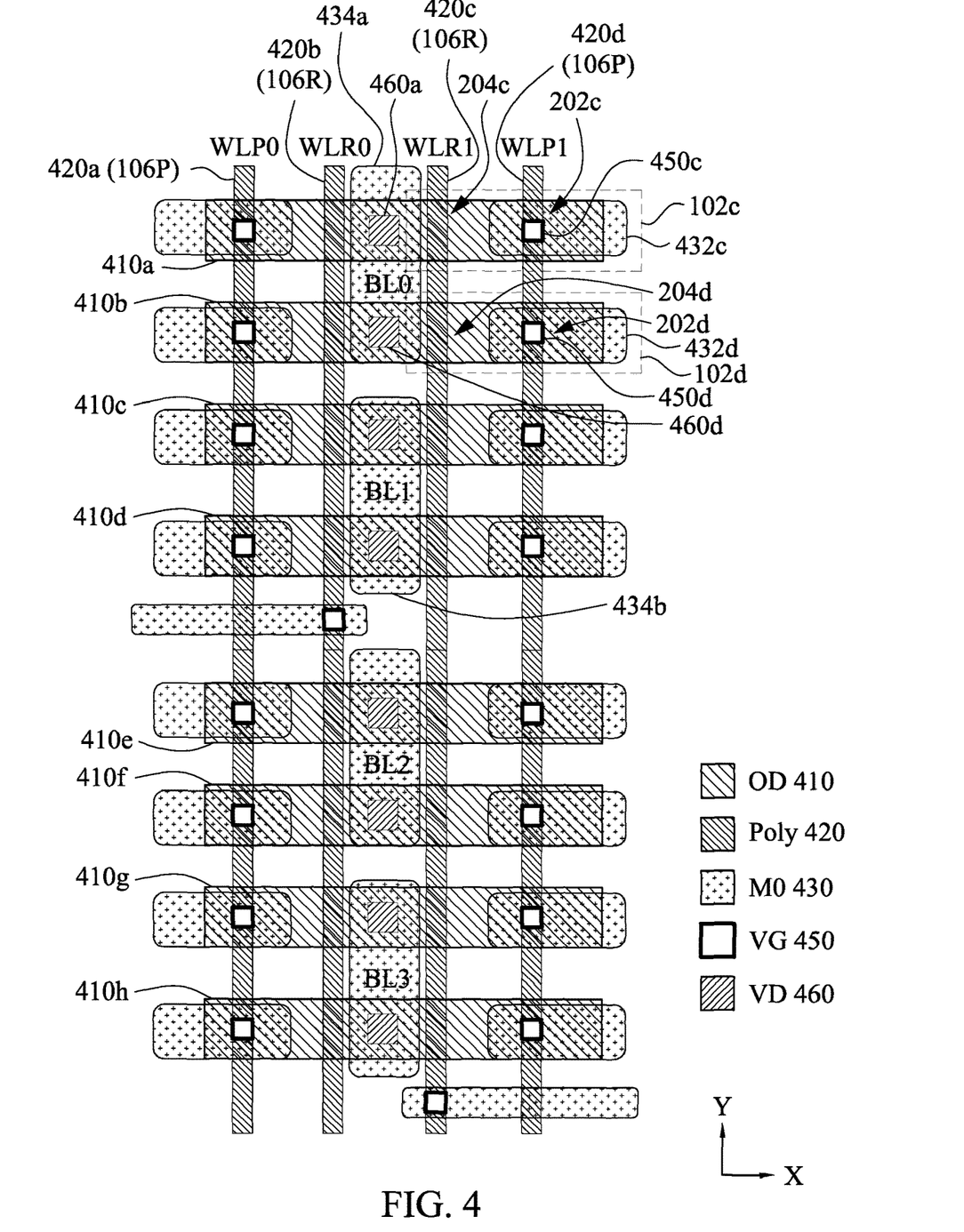
FIG. 4 is a layout diagram of the memory array of FIG. 3.

FIG. 3 is a structure diagram of a memory array in accordance with some embodiments. FIG. 4 is a layout diagram of the memory array of FIG. 3. FIG. 3 is described in conjunction with FIG. 4. In the illustrated example, a memory array 104 includes 16 OTP memory cells 102a-102p (collectively 102). The 16 OTP memory cells 102a-102p are arranged in 8 rows and 2 columns. Each of the 16 OTP memory cells 102a-102p has a two-transistor structure as shown in FIG. 2.

In the first column, gates of antifuse transistors of the OTP memory cells 102a, 102b, 102e, 102f, 102i, 102j, 102m, and 102n are connected to a word line 106P that receives a WLP signal WLP0, while gates of selection transistors of the OTP memory cells 102a, 102b, 102e, 102f, 102i, 102j, 102m, and 102n are connected to a word line 106R that receives a WLR signal WLR0. In the second column, gates of antifuse transistors of the OTP memory cells 102c, 102d, 102g, 102h, 102k, 102l, 102o, and 102p are connected to another word line 106P that receives another WLP signal WLP1, while gates of selection transistors of the OTP memory cells 102c, 102d, 102g, 102h, 102k, 102l, 102o, and 102p are connected to a word line 106R that receives another WLR signal WLR1.

In a first row, the OTP memory cells 102a and 102c are connected in series. In a second row, the OTP memory cells 102b and 102d are connected in series. In a third row, the OTP memory cells 102e and 102g are connected in series. In a fourth row, the OTP memory cells 102f and 102h are connected in series. In a fifth row, the OTP memory cells 102i and 102k are connected in series. In a sixth row, the OTP memory cells 102j and 102l are connected in series. In a seventh row, the OTP memory cells 102m and 102o are connected in series. In an eighth row, the OTP memory cells 102n and 102p are connected in series.

The OTP memory cells 102a, 102b, 102c, and 102d are all connected to a bit line 112 that receives a signal BL0. As such, the OTP memory cells 102a and 102b together are used to store 1 bit of data. In other words, two OTP memory cells are used per bit. A bit cell 302 includes two OTP memory cells: the OTP memory cells 102a and 102b. Only one bit cell 302 is identified in FIG. 3 for simplicity. Likewise, the OTP memory cells 102c and 102d together are used to store 1 bit of data. The OTP memory cells 102e, 102f, 102g, and 102h are all connected to a bit line 112 that receives a signal BL1. As such, the OTP memory cells 102e and 102f together are used to store 1 bit of data, whereas the OTP memory cells 102g and 102h together are used to store 1 bit of data. The OTP memory cells 102i, 102j, 102k, and 102l are all connected to a bit line 112 that receives a signal BL2. As such, the OTP memory cells 102i and 102j together are used to store 1 bit of data, whereas the OTP memory cells 102k and 102l together are used to store 1 bit of data. The OTP memory cells 102m, 102n, 102o, and 102p are all connected to a bit line 112 that receives a signal BL3. As such, the OTP memory cells 102m and 102n together are used to store 1 bit of data, whereas the OTP memory cells 102o and 102p together are used to store 1 bit of data. In summary, the memory array 104 includes 16 OTP memory cells 102a-102p and 8 bit cells 302 in the illustrated four-transistor per bit (i.e., 2 cells per bit) arrangement.

Now referring to FIG. 4, a layout of the memory array 104 of FIG. 3 is illustrated. Eight active regions (OD regions) 410a-410h (collectively 410) are disposed on a substrate and extend in an X direction.

Four gate (poly) strips 420a, 420b, 420c, and 420d are disposed on the eight active regions 410a-410h and extend in a Y direction. The Y direction is perpendicular to the X direction. The gate strip 420a serves as gates of antifuse transistors and the WLP signal WLP0 on the word line 106P can be applied to the gate strip 420a. The gate strip 420b serves as gates of selection transistors and the WLR signal WLR0 on the word line 106R can be applied to the gate strip 420b. The gate strip 420c serves as gates of selection transistors and the WLR signal WLR1 on the word line 106R can be applied to the gate strip 420c. The gate strip 420d serves as gates of antifuse transistors and the WLP signal WLP1 on the word line 106P can be applied to the gate strip 420d.

For simplicity, only the OTP memory cells 102c and 102d are described in detail. As mentioned earlier, the OTP memory cells 102c and 102d together are used to store 1 bit of data. The OTP memory cell 102c includes a selection transistor 204c and an antifuse transistor 202c, both of which are located in the active region 410a. The gate strip 420c serves as a gate of the selection transistor 204c whereas the gate strip 420d serves as a gate of the antifuse transistor 202c. The gate of the antifuse transistor 202c is connected to a metal track 432c through a vertical interconnect access (via) VG 450c. The metal track 432c can receive the WLP signal WLP1. A source or a drain of the selection transistor 204c is connected to a metal track 434a through a via VD 460a. The metal track 434a can receive the signal BL0.

Likewise, the OTP memory cell 102d includes a selection transistor 204d and an antifuse transistor 202d, both of which are located in the active region 410b. The gate strip 420c serves as a gate of the selection transistor 204d whereas the gate strip 420d serves as a gate of the antifuse transistor 202d. The gate of the antifuse transistor 202d is connected to a metal track 432d through a via VG 450d. The metal track 432d can receive the WLP signal WLP1. A source or a drain of the selection transistor 204d is connected to the metal track 434a through a via VD 460b. The metal track 434a can receive the signal BL0. As such, both the OTP memory cell 102c and the OTP memory cell 102d are connected to the metal track 434a through the via VD 460a and the via VD 460b, respectively. Since the selection transistor 204c and the selection transistor 204d are both controlled by the WLR signal WLR1, the OTP memory cells 102c and 102d together are used to store 1 bit of data. In other words, two OTP memory cells are used per bit.

In terms of layout area, the width (e.g., two fin counts) of active regions 410a-410h of the four-transistor per bit (i.e., 2 cells per bit) arrangement is half of the width (e.g., four fin counts) of active regions of a two-transistor per bit (i.e., 1 cell per bit) arrangement, the overall layout areas are the same while cell current of the four-transistor per bit (i.e., 2 cells per bit) arrangement increases, which will be explained in detail later.

Figure 5:
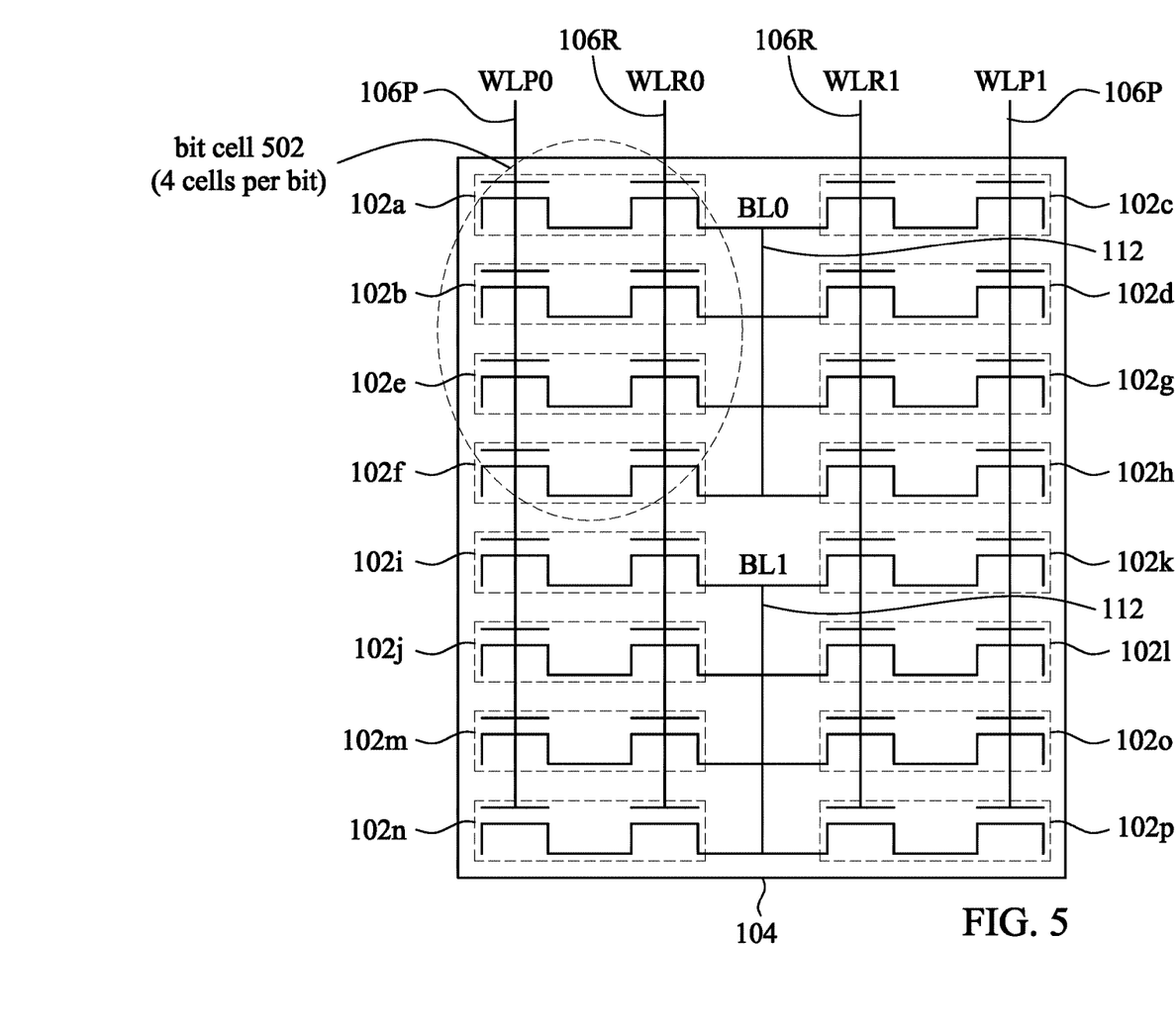
FIG. 5 is a structure diagram of a memory array in accordance with some embodiments.
Figure 6:
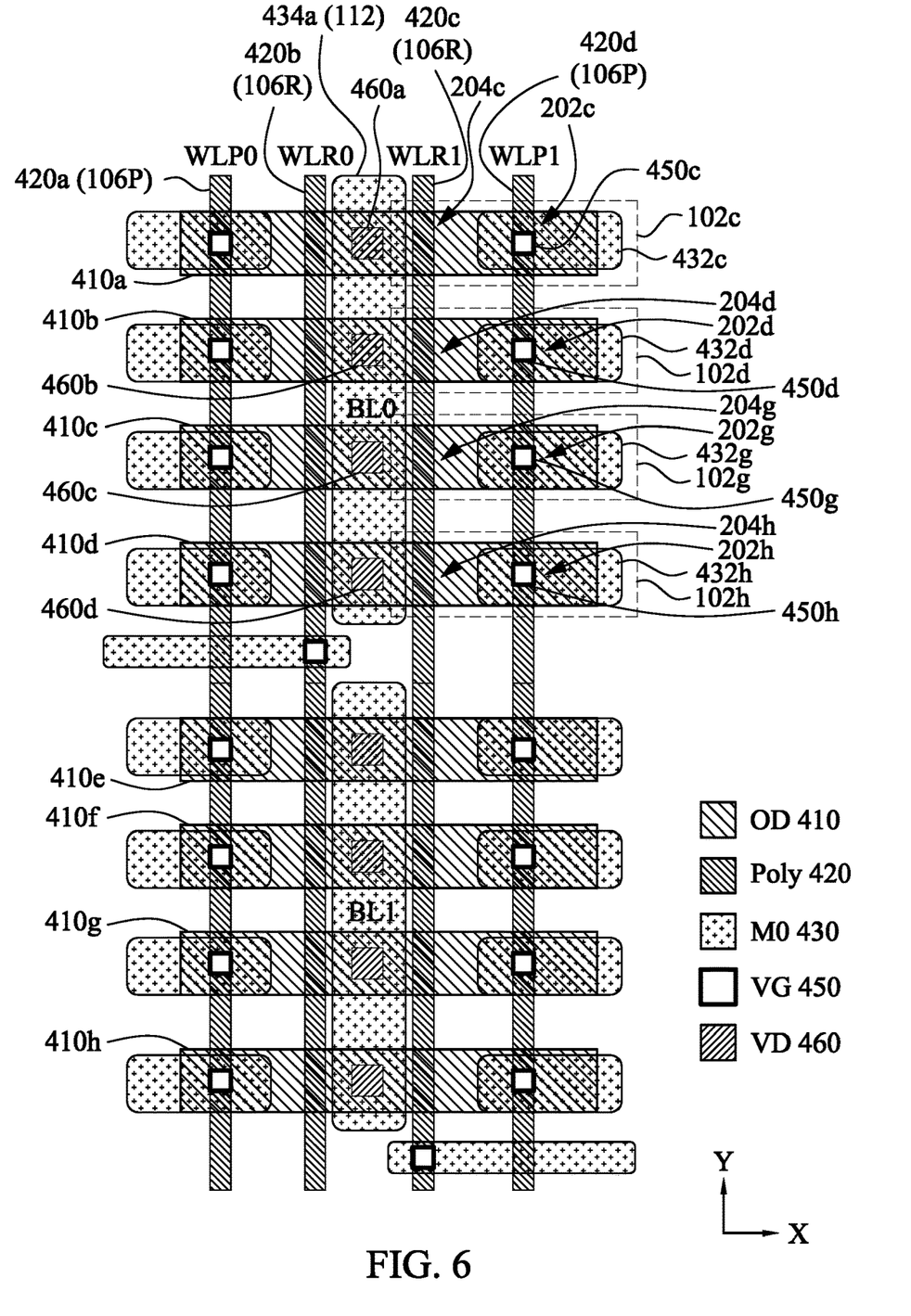
FIG. 6 is a layout diagram of the memory array of FIG. 5.
Figure 7:
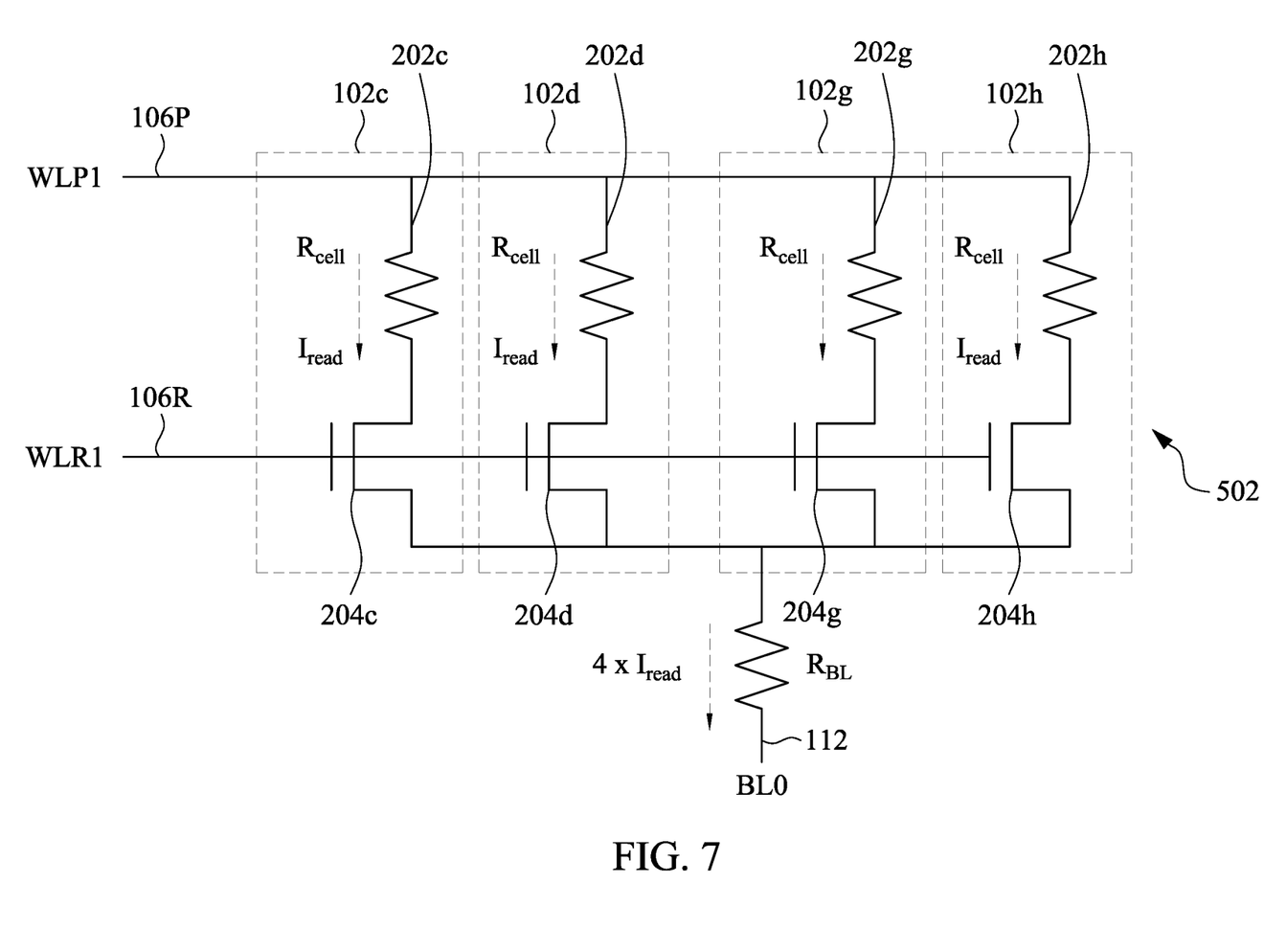
FIG. 7 is an equivalent circuit diagram of four OTP memory cells of the memory array of FIG. 5.
Figure 8:
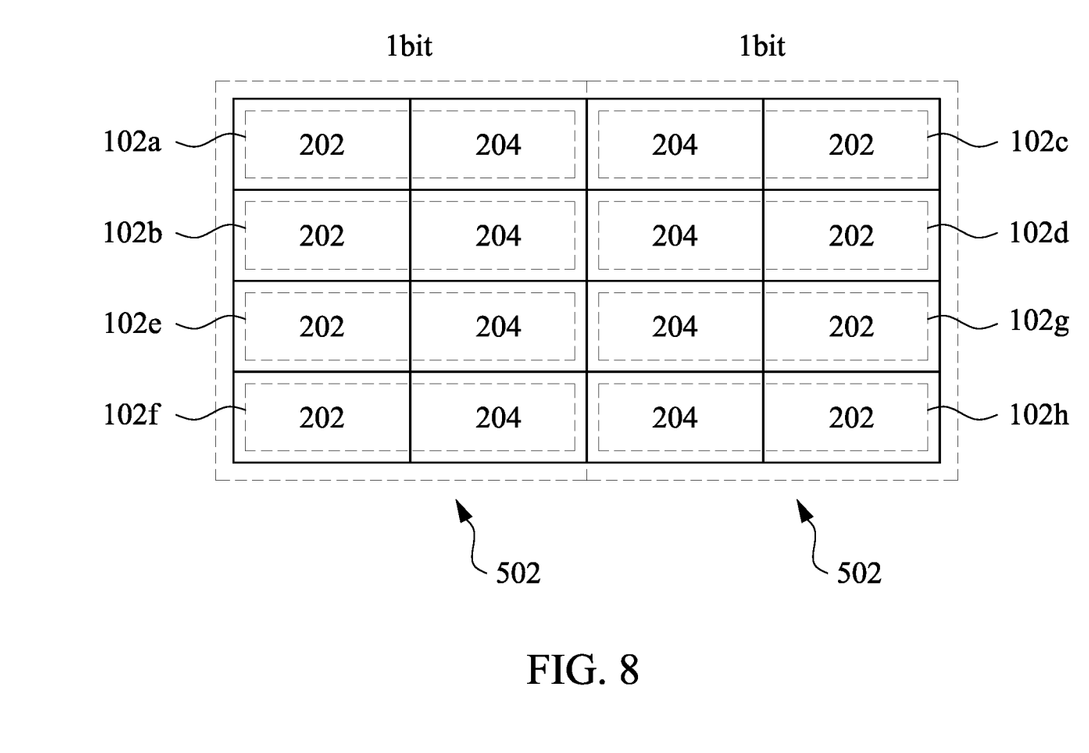
FIG. 8 is a schematic diagram of eight OTP memory cells of the memory array of FIG. 5.

FIG. 5 is a structure diagram of a memory array in accordance with some embodiments. FIG. 6 is a layout diagram of the memory array of FIG. 5. FIG. 7 is an equivalent circuit diagram of four OTP memory cells of the memory array of FIG. 5. FIG. 8 is a schematic diagram of eight OTP memory cells of the memory array of FIG. 5. FIG. 5 is described in conjunction with FIGS. 6-8. In the illustrated example, a memory array 104 includes 16 OTP memory cells 102a-102p (collectively 102). The 16 OTP memory cells 102a-102p are arranged in 8 rows and 2 columns. Each of the 16 OTP memory cells 102l-102p has a two-transistor structure as shown in FIG. 2.

In the first column, gates of antifuse transistors of the OTP memory cells 102a, 102b, 102e, 102f, 102i, 102j, 102m, and 102n are connected to a word line 106P that receives a WLP signal WLP0, while gates of selection transistors of the OTP memory cells 102a, 102b, 102e, 102f, 102i, 102j, 102m, and 102n are connected to a word line 106R that receives a WLR signal WLR0. In the second column, gates of antifuse transistors of the OTP memory cells 102c, 102d, 102g, 102h, 102k, 102l, 102o, and 102p are connected to another word line 106P that receives another WLP signal WLP1, while gates of selection transistors of the OTP memory cells 102c, 102d, 102g, 102h, 102k, 102l, 102o, and 102p are connected to a word line 106R that receives another WLR signal WLR1.

In a first row, the OTP memory cells 102a and 102c are connected in series. In a second row, the OTP memory cells 102b and 102d are connected in series. In a third row, the OTP memory cells 102e and 102g are connected in series. In a fourth row, the OTP memory cells 102f and 102h are connected in series. In a fifth row, the OTP memory cells 102i and 102k are connected in series. In a sixth row, the OTP memory cells 102j and 102l are connected in series. In a seventh row, the OTP memory cells 102m and 102o are connected in series. In an eighth row, the OTP memory cells 102n and 102p are connected in series.

The OTP memory cells 102a, 102b, 102c, 102d, 102e, 102f, 102g, and 102h are all connected to a bit line 112 that receives a signal BL0. As such, the OTP memory cells 102a, 102b, 102e, and 102f together are used to store 1 bit of data. In other words, four OTP memory cells are used per bit. A bit cell 502 includes four OTP memory cells: the OTP memory cells 102a, 102b, 102e, and 102f. Only one bit cell 502 is identified in FIG. 5 for simplicity. Likewise, the OTP memory cells 102c, 102d, 102g, and 102h together are used to store 1 bit of data. The OTP memory cells 102i, 102j, 102k, 102l, 102m, 102n, 102o, and 102p are all connected to a bit line 112 that receives a signal BL1. As such, the OTP memory cells 102i, 102j, 102m, and 102n together are used to store 1 bit of data, whereas the OTP memory cells 102k, 102l, 102o, and 102p together are used to store 1 bit of data. In summary, the memory array 104 includes 16 OTP memory cells 102a-102p and 4 bit cells 502 in the illustrated eight-transistor per bit (i.e., 4 cells per bit) arrangement.

Now referring to FIG. 6, a layout of the memory array 104 of FIG. 5 is illustrated. Eight active regions (OD regions) 410a-410h (collectively 410) are disposed on a substrate and extend in an X direction.

Four gate (poly) strips 420a, 420b, 420c, and 420d are disposed on the eight active regions 410a-410h and extend in a Y direction. The Y direction is perpendicular to the X direction. The gate strip 420a serves as gates of antifuse transistors and the WLP signal WLP0 on the word line 106P can be applied to the gate strip 420a. The gate strip 420b serves as gates of selection transistors and the WLR signal WLR0 on the word line 106P can be applied to the gate strip 420b. The gate strip 420c serves as gates of selection transistors and the WLR signal WLR1 on the word line 106P can be applied to the gate strip 420c. The gate strip 420d serves as gates of antifuse transistors and the WLP signal WLP1 on the word line 106P can be applied to the gate strip 420d.

For simplicity, only the OTP memory cells 102c, 102d, 102g, and 102h are described in detail. As mentioned earlier, the OTP memory cells 102c, 102d, 102g, and 102h together are used to store 1 bit of data. The OTP memory cell 102c includes a selection transistor 204c and an antifuse transistor 202c, both of which are located in the active region 410a. The gate strip 420c serves as a gate of the selection transistor 204c whereas the gate strip 420d serves as a gate of the antifuse transistor 202c. The gate of the antifuse transistor 202c is connected to a metal track 432c through a via VG 450c. The metal track 432c can receive the WLP signal WLP1. A source or a drain of the selection transistor 204c is connected to a metal track 434a through a via VD 460a. The metal track 434a can receive the signal BL0.

Likewise, the OTP memory cell 102d includes a selection transistor 204d and an antifuse transistor 202d, both of which are located in the active region 410b. The gate strip 420c serves as a gate of the selection transistor 204d whereas the gate strip 420d serves as a gate of the antifuse transistor 202d. The gate of the antifuse transistor 202d is connected to a metal track 432d through a via VG 450d. The metal track 432d can receive the WLP signal WLP1. A source or a drain of the selection transistor 204d is connected to the metal track 434a through a via VD 460b. The metal track 434a can receive the signal BL0.

Likewise, the OTP memory cell 102g includes a selection transistor 204g and an antifuse transistor 202g, both of which are located in the active region 410c. The gate strip 420c serves as a gate of the selection transistor 204g whereas the gate strip 420d serves as a gate of the antifuse transistor 202g. The gate of the antifuse transistor 202g is connected to a metal track 432g through a via VG 450g. The metal track 432g can receive the WLP signal WLP1. A source or a drain of the selection transistor 204g is connected to the metal track 434a through a via VD 460c. The metal track 434a can receive the signal BL0.

Likewise, the OTP memory cell 102h includes a selection transistor 204h and an antifuse transistor 202h, both of which are located in the active region 410d. The gate strip 420c serves as a gate of the selection transistor 204h whereas the gate strip 420d serves as a gate of the antifuse transistor 202h. The gate of the antifuse transistor 202h is connected to a metal track 432h through a via VG 450h. The metal track 432h can receive the WLP signal WLP1. A source or a drain of the selection transistor 204h is connected to the metal track 434a through a via VD 460d. The metal track 434a can receive the signal BL0. As such, the OTP memory cells 102c, 102d, 102g, and 102h are connected to the metal track 434a through the via VD 460a, the via VD 460b, the via VD 460c, and the via VD 460d, respectively. Since the selection transistors 204c, 204d, 204g, and 204h are all controlled by the WLR signal WLR1, the OTP memory cells 102c, 102d, 102g, and 102h together are used to store 1 bit of data. In other words, four OTP memory cells are used per bit.

In terms of layout area, the width (e.g., two fin counts) of active regions 410a-410h of the eight-transistor per bit (i.e., 4 cells per bit) arrangement is half of the width (e.g., four fin counts) of active regions of a two-transistor per bit (i.e., 1 cell per bit) arrangement, the overall layout areas are the same while cell current of the eight-transistor per bit (i.e., 4 cells per bit) arrangement increases, which will be explained in detail with reference of FIG. 7.

Now referring to FIG. 7, an equivalent circuit including the OTP memory cells 102c, 102d, 102g, and 102h are illustrated. As mentioned earlier, the OTP memory cells 102c, 102d, 102g, and 102h are used to store 1 bit of data. By applying an appropriate voltage for the WLP signal WLP1, the antifuse transistors 202c, 202d, 202g, and 202h are in a low resistance state. As such, each of the antifuse transistors 202c, 202d, 202g, and 202h functions as a resistor with a resistance of $R_{cell}$. By applying an appropriate voltage for the WLR signal WLR1, the selection transistors 204c, 204d, 204g, and 204h are turned on. Accordingly, each of the OTP memory cells 102c, 102d, 102g, and 102h has a current $I_{read}$ flowing to the bit line 112. As a result, the current on the bit line 112 is $4I_{read}$ since four OTP memory cells 102c, 102d, 102g, and 102h are connected in parallel. Compared with the two-transistor per bit (i.e., 1 cell per bit) arrangement, the eight-transistor per bit (i.e., 4 cells per bit) arrangement illustrated in FIGS. 5-8 results in a bigger current which is easier to be read on-cell. It should be noted that the four-transistor per bit (i.e., 2 cells per bit) arrangement illustrated in FIGS. 3-4 also results in a bigger current compared with the two-transistor per bit (i.e., 1 cell per bit) arrangement.

Now referring to FIG. 8, the eight-transistor per bit (i.e., 4 cells per bit) arrangement illustrated. Specifically, the OTP memory cells 102c, 102d, 102g, and 102h are used to store 1 bit of data. Likewise, the OTP memory cells 102a, 102b, 102e, and 102f are used to store 1 bit of data. From a transistor perspective, the OTP memory cells 102c, 102d, 102g, and 102h have eight transistors. In this illustrated example, there are four antifuse transistors 202 and four selection transistors 204. It should be noted that in other embodiments of the eight-transistor per bit (i.e., 4 cells per bit) arrangement, there may be n antifuse transistors 202 and m selection transistors 204, where n is an integer greater or equal to 1 and m is an integer greater or equal to 1. Further, m and n may be different.

Figure 9:
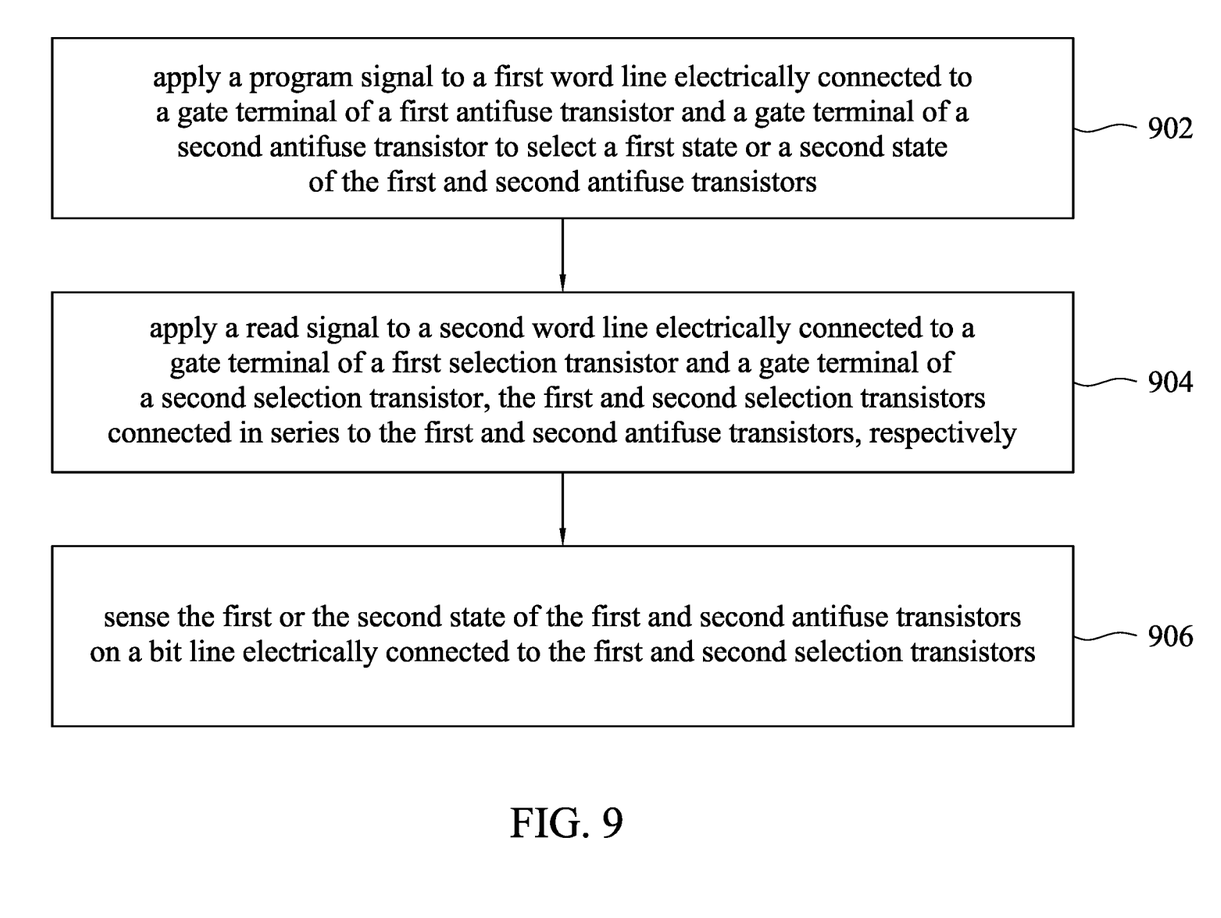
FIG. 9 is a flow chart illustrating a method for operating a memory device in accordance with some embodiments.

FIG. 9 is a flow chart illustrating a method for operating a memory device, such as the example memory device 101 shown in FIG. 1, in accordance with some embodiments. At step 902, a program signal is applied to a first word line electrically connected to a gate terminal of a first antifuse transistor and a gate terminal of a second antifuse transistor to select a first state or a second state of the first and second antifuse transistors. At step 904, a read signal is applied to a second word line electrically connected to a gate terminal of a first selection transistor and a gate terminal of a second selection transistor. The first and second selection transistors are connected in series to the first and second antifuse transistors, respectively. At step 906, the first or the second state of the first and second antifuse transistors on a bit line is sensed. The bit line is electrically connected to the first and second selection transistors.

In one aspect, a memory bit cell is provided. The memory bit cell includes a first memory cell including a first antifuse transistor and a first selection transistor electrically connected in series, the first antifuse transistor being selectable between a first state or a second state in response to a first signal, the first selection transistor being configured to provide access to the first antifuse transistor in response to a second signal; a second memory cell including a second antifuse transistor and a second selection transistor electrically connected in series, the second antifuse transistor being selectable between the first state or the second state in response to the first signal, the second selection transistor being configured to provide access to the second antifuse transistor in response to the second signal; a first word line connected to gate terminals of the first and second antifuse transistors to selectively provide the first signal to the first and second antifuse transistors; a second word line connected to gate terminals of the first and second selection transistors to selectively provide the second signal to the first and second selection transistors; and a bit line electrically connected to the first and second selection transistors for sensing the first state or the second state of the first and second antifuse transistors.

In another aspect, a memory device is provided. The memory device includes a memory array having an array of memory bit cells, the array having a plurality of columns and a plurality of rows, and each memory bit cell having: a first memory cell including a first antifuse transistor and a first selection transistor electrically connected in series, the first antifuse transistor being selectable between a first state or a second state in response to a first signal, the first selection transistor being configured to provide access to the first antifuse transistor in response to a second signal; a second memory cell including a second antifuse transistor and a second selection transistor electrically connected in series, the second antifuse transistor being selectable between the first state or the second state in response to the first signal, the second selection transistor being configured to provide access to the second antifuse transistor in response to the second signal; a first word line connected to gate terminals of the first and second antifuse transistors to selectively provide the first signal to the first and second antifuse transistors; a second word line connected to gate terminals of the first and second selection transistors to selectively provide the second signal to the first and second selection transistors; and a bit line electrically connected to the first and second selection transistors for sensing the first state or the second state of the first and second antifuse transistors. The memory device further includes a column select circuit for selecting a column of the plurality of columns; and a row select circuit for selecting a row of the plurality of rows.

In yet another aspect, a method is provided. The method includes applying a program signal to a first word line electrically connected to a gate terminal of a first antifuse transistor and a gate terminal of a second antifuse transistor to select a first state or a second state of the first and second antifuse transistors; applying a read signal to a second word line electrically connected to a gate terminal of a first selection transistor and a gate terminal of a second selection transistor, the first and second selection transistors connected in series to the first and second antifuse transistors, respectively; and sensing the first or the second state of the first and second antifuse transistors on a bit line electrically connected to the first and second selection transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory bit cell, comprising:
   a first memory cell including a first antifuse transistor and a first selection transistor electrically connected in series, the first antifuse transistor being selectable between a first state or a second state in response to a word line program signal, the first selection transistor being configured to provide access to the first antifuse transistor in response to a word line read signal;
   a second memory cell including a second antifuse transistor and a second selection transistor electrically connected in series, the second antifuse transistor being selectable between the first state or the second state in response to the word line program signal, the second selection transistor being configured to provide access to the second antifuse transistor in response to the word line read signal;
   a first word line connected to gate terminals of the first and second antifuse transistors to selectively provide the word line program signal to the first and second antifuse transistors;
   a second word line connected to gate terminals of the first and second selection transistors to selectively provide the word line read signal to the first and second selection transistors; and
   a bit line electrically connected to the first and second selection transistors for sensing the first state or the second state of the first and second antifuse transistors.

2. The memory bit cell of claim 1, wherein the first state is a low resistance state and the second state is a high resistance state.

3. The memory bit cell of claim 2, wherein each of the first and second antifuse transistors has a permanent electrically conductive path associated with the first state.

4. The memory bit cell of claim 1, wherein a first thickness of gate dielectric layers of the first and second antifuse transistors is less than a second thickness of gate dielectric layers of the first and second selection transistors.

5. The memory bit cell of claim 1, wherein the first and second antifuse transistors are n-type.

6. The memory bit cell of claim 1, wherein the first and second antifuse transistors are p-type.

7. A memory device, comprising:
   a memory array having an array of memory bit cells, the array having a plurality of columns and a plurality of rows, and each memory bit cell having:
   a first memory cell including a first antifuse transistor and a first selection transistor electrically connected in series, the first antifuse transistor being selectable between a first state or a second state in response to a word line program signal, the first selection transistor being configured to provide access to the first antifuse transistor in response to a word line read signal;
   a second memory cell including a second antifuse transistor and a second selection transistor electrically connected in series, the second antifuse transistor being selectable between the first state or the second state in response to the word line program signal, the second selection transistor being configured to provide access to the second antifuse transistor in response to the word line read signal;

a first word line connected to gate terminals of the first and second antifuse transistors to selectively provide the word line program signal to the first and second antifuse transistors;

a second word line connected to gate terminals of the first and second selection transistors to selectively provide the word line read signal to the first and second selection transistors; and a bit line electrically connected to the first and second selection transistors for sensing the first state or the second state of the first and second antifuse transistors;

a column select circuit for selecting a column of the plurality of columns; and a row select circuit for selecting a row of the plurality of rows.

8. The memory device of claim 7, further comprising:
a processing device operatively connected to the memory array, the column select circuit, and the row select circuit.

9. The memory device of claim 7, further comprising:
a power supply providing one or more bias voltages to the memory array.

10. The memory device of claim 7, wherein the first state is a low resistance state and the second state is a high resistance state.

11. The memory device of claim 10, wherein each of the first and second antifuse transistors has a permanent electrically conductive path associated with the first state.

12. The memory device of claim 7, wherein a first thickness of gate dielectric layers of the first and second antifuse transistors is less than a second thickness of gate dielectric layers of the first and second selection transistors.

13. The memory device of claim 7, wherein the first and second antifuse transistors are n-type.

14. The memory device of claim 7, wherein the first and second antifuse transistors are p-type.

15. A memory array, comprising:
an array of memory bit cells, the array having a plurality of columns and a plurality of rows, and each memory bit cell having:

a first memory cell including a first antifuse transistor and a first selection transistor electrically connected in series, the first antifuse transistor being selectable between a first state or a second state in response to a word line program signal, the first selection transistor being configured to provide access to the first antifuse transistor in response to a word line read signal;

a second memory cell including a second antifuse transistor and a second selection transistor electrically connected in series, the second antifuse transistor being selectable between the first state or the second state in response to the word line program signal, the second selection transistor being configured to provide access to the second antifuse transistor in response to the word line read signal;

a first word line connected to gate terminals of the first and second antifuse transistors to selectively provide the word line program signal to the first and second antifuse transistors;

a second word line connected to gate terminals of the first and second selection transistors to selectively provide the word line read signal to the first and second selection transistors; and a bit line electrically connected to the first and second selection transistors for sensing the first state or the second state of the first and second antifuse transistors.

16. The memory array of claim 15, wherein the first state is a low resistance state and the second state is a high resistance state.

17. The memory array of claim 16, wherein each of the first and second antifuse transistors has a permanent electrically conductive path associated with the first state.

18. The memory array of claim 15, wherein a first thickness of gate dielectric layers of the first and second antifuse transistors is less than a second thickness of gate dielectric layers of the first and second selection transistors.

19. The memory array of claim 15, wherein the first and second antifuse transistors are n-type.

20. The memory array of claim 15, wherein the first and second antifuse transistors are p-type.

* * * * *